(12) United States Patent
Deb et al.

(10) Patent No.: US 8,493,246 B2
(45) Date of Patent: Jul. 23, 2013

(54) METHODS AND SYSTEMS FOR DECODING DATA

(75) Inventors: Budhaditya Deb, Niskayuna, NY (US); John Anderson Fergus Ross, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 41 days.

(21) Appl. No.: 13/331,625

(22) Filed: Dec. 20, 2011

(65) Prior Publication Data

US 2013/0154859 A1     Jun. 20, 2013

(51) Int. Cl.
*H03M 5/06*     (2006.01)

(52) U.S. Cl.
USPC ............................................. 341/68; 341/59

(58) Field of Classification Search
USPC ............ 341/68, 58, 59, 52; 369/47.15, 59.24, 369/275.1, 275.4
See application file for complete search history.

(56) References Cited

U.S. PATENT DOCUMENTS

| | | | |
|---|---|---|---|
| 7,224,911 B2 | 5/2007 | Dai et al. | |
| 8,384,567 B2 * | 2/2013 | Higashino | ........................ 341/59 |
| 2009/0067309 A1 | 3/2009 | Kobayashi et al. | |
| 2009/0180375 A1 | 7/2009 | Miyashita et al. | |
| 2010/0226218 A1 | 9/2010 | Nakamura et al. | |

OTHER PUBLICATIONS

Reed, I. S. and Solomon, G.; "Polynomial Codes Over Certain Finite Fields"; SIAM Journal of Applied Math., vol. 8, No. 2; 1960; pp. 300-304.
L. R. Bahl, J. Cocke, F. Jelinek, and J. Raviv; "Optimal Decoding of Linear Codes for Minimizing Symbol Error Rate"; IEEE Transactions on Information Theory, vol. 20; Mar. 1974; pp. 284-287.
Claude Berrou, Alain Glavieux and Punya Thitimajshima; "Near Shannon Limit Error—Correcting Coding and Decoding : Turbo-Codes (1)"; Communications, 1993. ICC 93. Geneva. Technical Program, Conference Record, IEEE International Conference, vol. 2; pp. 1064-1070.
C. Gu, F. Dai and J. Hong; "Statistics of both optical and electrical noise in digital volume holographic data storage"; Electronics Letters, Jul. 18, 1996, vol. 32, No. 15; pp. 1400-1402.
D.J.C. MacKay and R.M. Neal; "Near Shannon Limit Performance of Low Density Parity Check Codes", Electronics Letters Mar. 13, 1997 vol. 33 No. 6; pp. 457-458.

* cited by examiner

*Primary Examiner* — Joseph Lauture
(74) *Attorney, Agent, or Firm* — Richard A. DeChristofaro

(57) ABSTRACT

A method of decoding is presented. The method includes the steps of receiving a coded bit stream that is encoded using a Non Return to Zero Inverted (NRZI) code and a 17 Parity Preserve/Prohibit (17PP) code, determining a 17PP modulated bit stream based upon the coded bit stream using a first selected decoding method, and generating a plurality of decisions by processing the 17PP modulated bit stream using a second selected decoding method, wherein the received coded bit stream comprises a plurality of coded bits, and the plurality of decisions are estimates of a plurality of source bits in a source information.

25 Claims, 15 Drawing Sheets

METHODS AND SYSTEMS FOR DECODING DATA

BACKGROUND

The subject matter disclosed herein generally relates to data communication systems and methods. More specifically, the subject matter relate to methods and systems for decoding data from communications systems and storage devices.

Capacities of storage devices have increased significantly in the last three decades with improved speed of operation advancing many application areas like consumer video and data archiving. While earlier Compact Disc (CD) was capable of storing hundreds of megabytes (MB) of data, later Digital Versatile Disc (DVD) could enhance the storage capacity by 10 times. Recently, standardized Blu-ray Disc(C) has achieved storage capacity of 50 GB on a dual-layer disc.

Emerging technologies like Holographic Data Storage (HDS) are capable of storing information throughout of the volume of the storage medium unlike prior technologies which were capable of storing information on the surface of the medium. In conventional data storages, information is recorded a bit at a time in a linear fashion, whereas holographic data storage is capable of recording and reading millions of bits in parallel, enabling much higher data transfer rates.

Such storage devices may involve encoding and decoding of data signals. The decoding of signals may be related to the encoding process applied to the source data. Reliability of such storage systems depend on efficiency of the encoding and decoding operations. Faster decoding of the optically stored data in an efficient way is a desirable feature of storage systems for ease of use and suitability to emerging applications.

BRIEF DESCRIPTION

Briefly in accordance with one aspect of the present technique, a method is presented. The method includes receiving a coded bit stream that is encoded using a Non Return to Zero Inverted (NRZI) code and a 17 Parity Preserve/Prohibit (17PP) code, determining a 17PP modulated bit stream based upon the coded bit stream using a first selected decoding method, and generating a plurality of decisions by processing the 17PP modulated bit stream using a second selected decoding method, wherein the received coded bit stream comprises a plurality of coded bits, and the plurality of decisions are estimates of a plurality of source bits in a source information.

In accordance with another aspect of the present techniques, a decoding method including the steps of receiving a coded bit stream that is encoded using a Non Return to Zero Inverted (NRZI) code and a 17 Parity Preserve/Prohibit (17PP) code, selecting a combination of a NRZI decoding method and a 17PP decoding method from a plurality of NRZI decoding methods and a plurality of 17PP decoding methods, respectively based upon a plurality of operating conditions, determining a 17PP modulated bit stream based upon the coded bit stream using the NRZI decoding method and determining source information based upon the 17PP modulated bit stream using the 17PP decoding method.

In accordance with one aspect of the present systems, a system is presented. The system includes a data storage device that stores a coded bit stream that is encoded using a Non Return to Zero Inverted (NRZI) code and a 17 Parity Preserve/Prohibit (17PP) code, a processing system that is in an operational communication with the data storage device, wherein the processing system is configured to determine a 17PP modulated bit stream based upon the coded bit stream using an NRZI decoder, and generate a plurality of decisions by processing the 17PP modulated bit stream using a 17PP decoder, wherein the coded bit stream comprises a plurality of coded bits, and the plurality of decisions are estimates of a plurality of source bits in a source information.

In accordance with one aspect of the present systems, a system is presented. The system includes a data storage device that stores a coded bit stream that is encoded using a Non Return to Zero Inverted (NRZI) code and a 17 Parity Preserve/Prohibit (17PP) code, a processing system that is in an operational communication with the data storage device, wherein the processing system is configured to determine a 17PP modulated bit stream based upon the coded bit stream using a Hypothesis test decoding method, and generate a plurality of decisions by processing the 17PP modulated bit stream using a Naive decoding method, wherein the coded bit stream comprises a plurality of coded bits, and the plurality of decisions are estimates of a plurality of source bits in a source information.

In accordance with still another aspect of the present systems, a system is presented. The system includes a data storage device that stores a coded bit stream that is encoded using a Non Return to Zero Inverted (NRZI) code and a 17 Parity Preserve/Prohibit (17PP) code, a processing system that is in an operational communication with the data storage device, wherein the processing system is configured to determine a 17PP modulated bit stream based upon the coded bit stream using a Hypothesis test decoding method, and generate a plurality of decisions by processing the 17PP modulated bit stream using a BCJR method, wherein the coded bit stream comprises a plurality of coded bits, and the plurality of decisions are estimates of a plurality of source bits in a source information.

In accordance with still another aspect of the present systems, a communication system is presented. The communication system includes an encoder generating a coded bit stream that is encoded using a Non Return to Zero Inverted (NRZI) code and a 17 Parity Preserve/Prohibit (17PP) code, a decoder that receives the coded bit stream via a communication channel, wherein the decoder is configured to determine a 17PP modulated bit stream based upon the received coded bit stream using an NRZI decoder, and generate a plurality of decisions by processing the 17PP modulated bit stream using a 17PP decoder, wherein the coded bit stream comprises a plurality of coded bits, and the plurality of decisions are estimates of source bits in a source information.

DRAWINGS

These and other features and aspects of embodiments of the present invention will become better understood when the following detailed description is read with reference to the accompanying drawings in which like characters represent like parts throughout the drawings, wherein.

Figures 11A, 11B:
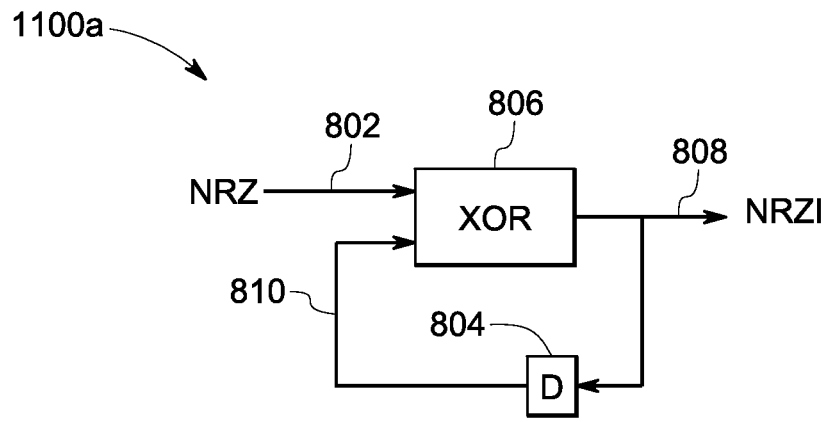
Figure 11C:
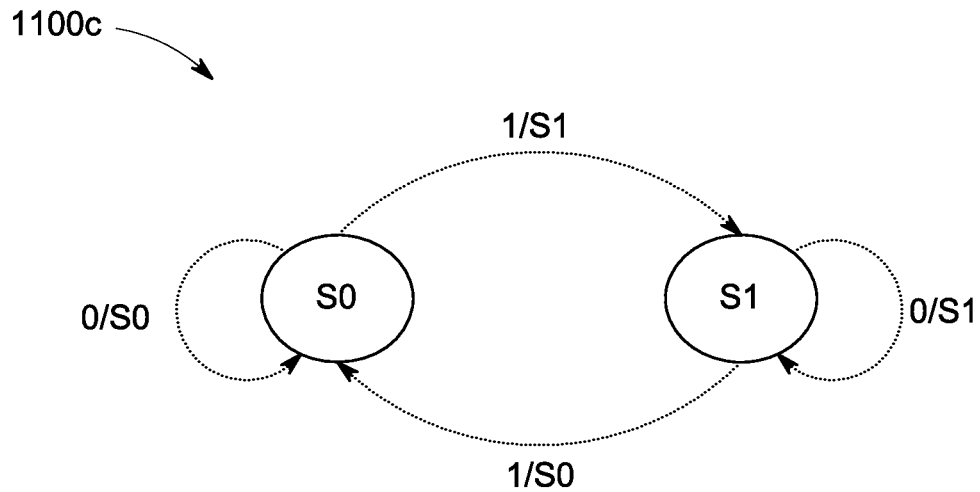
Figure 11D:
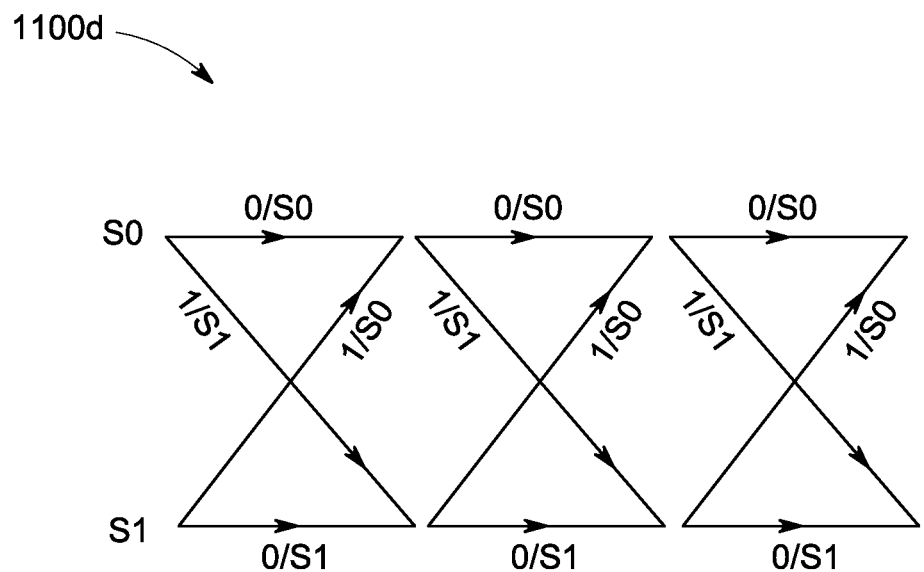
Figure 12:
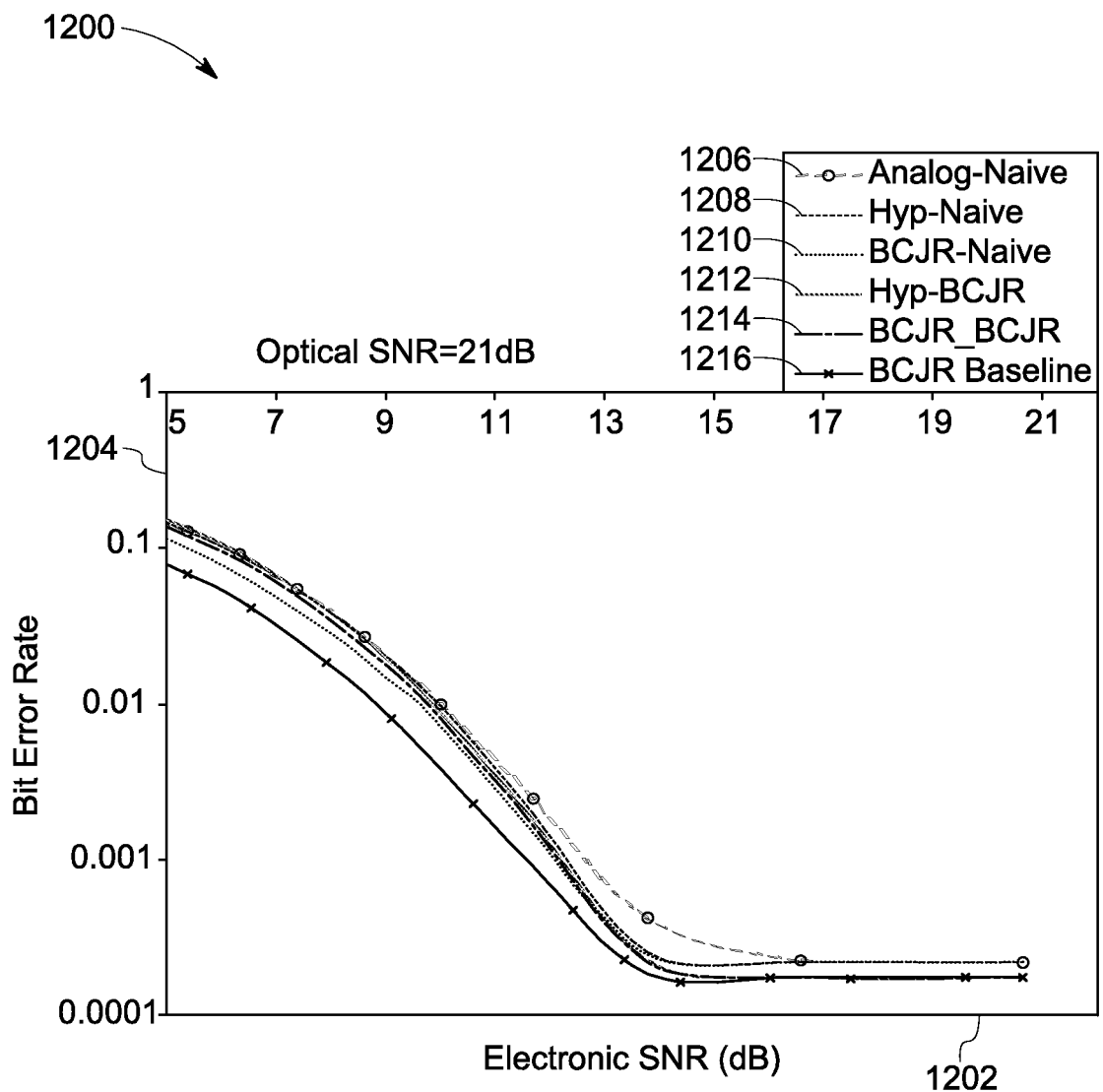
Figure 13:
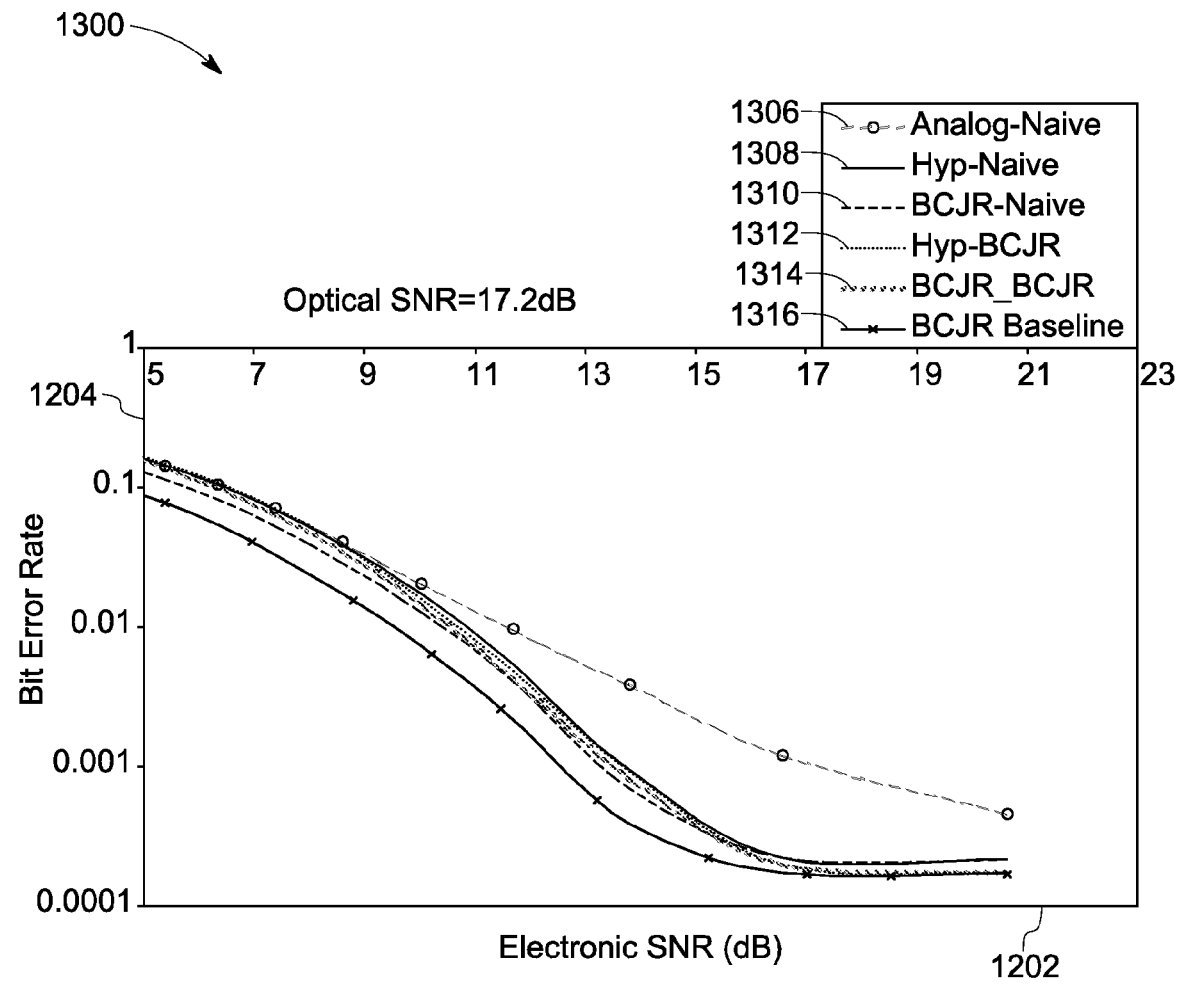
Figure 14:
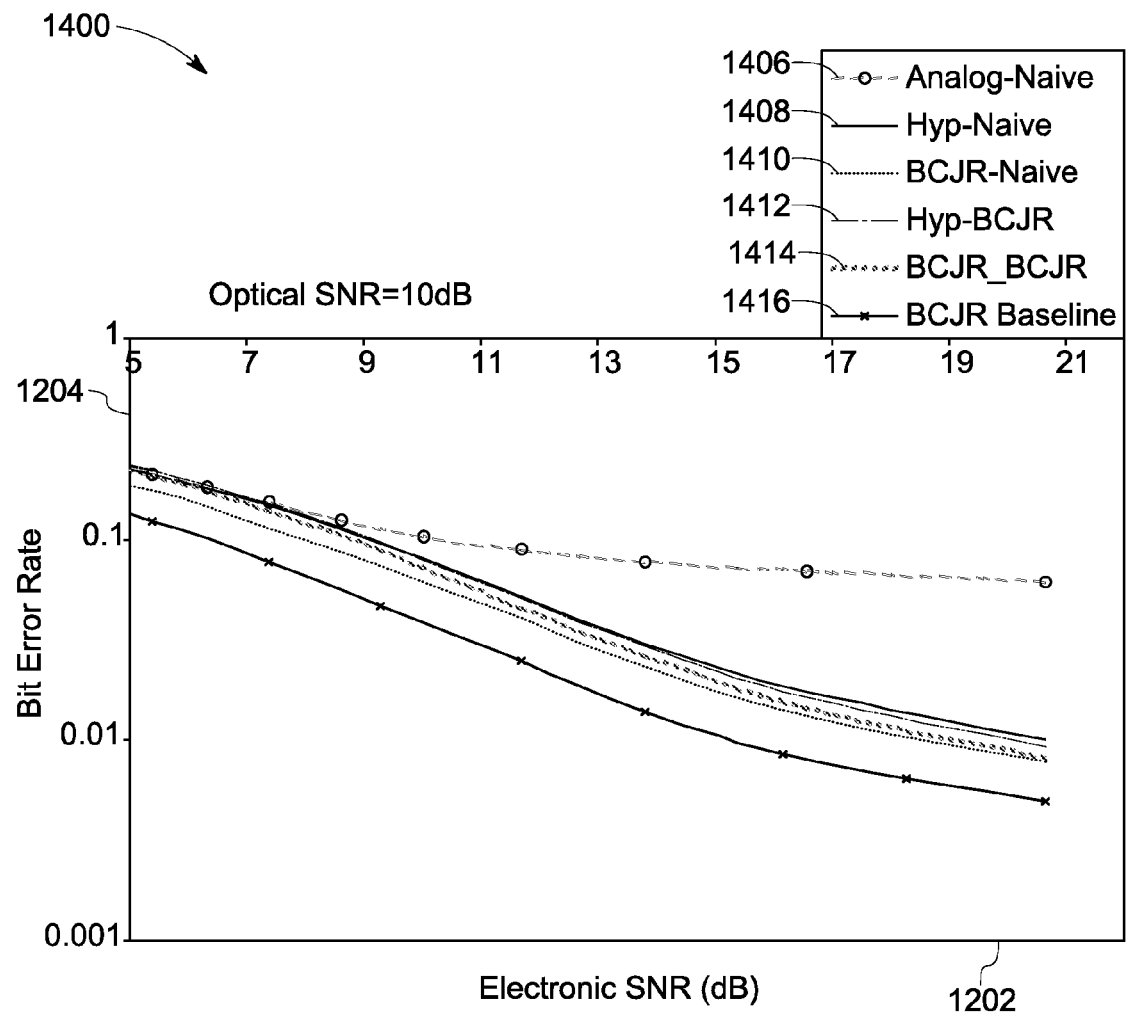
Figure 15:
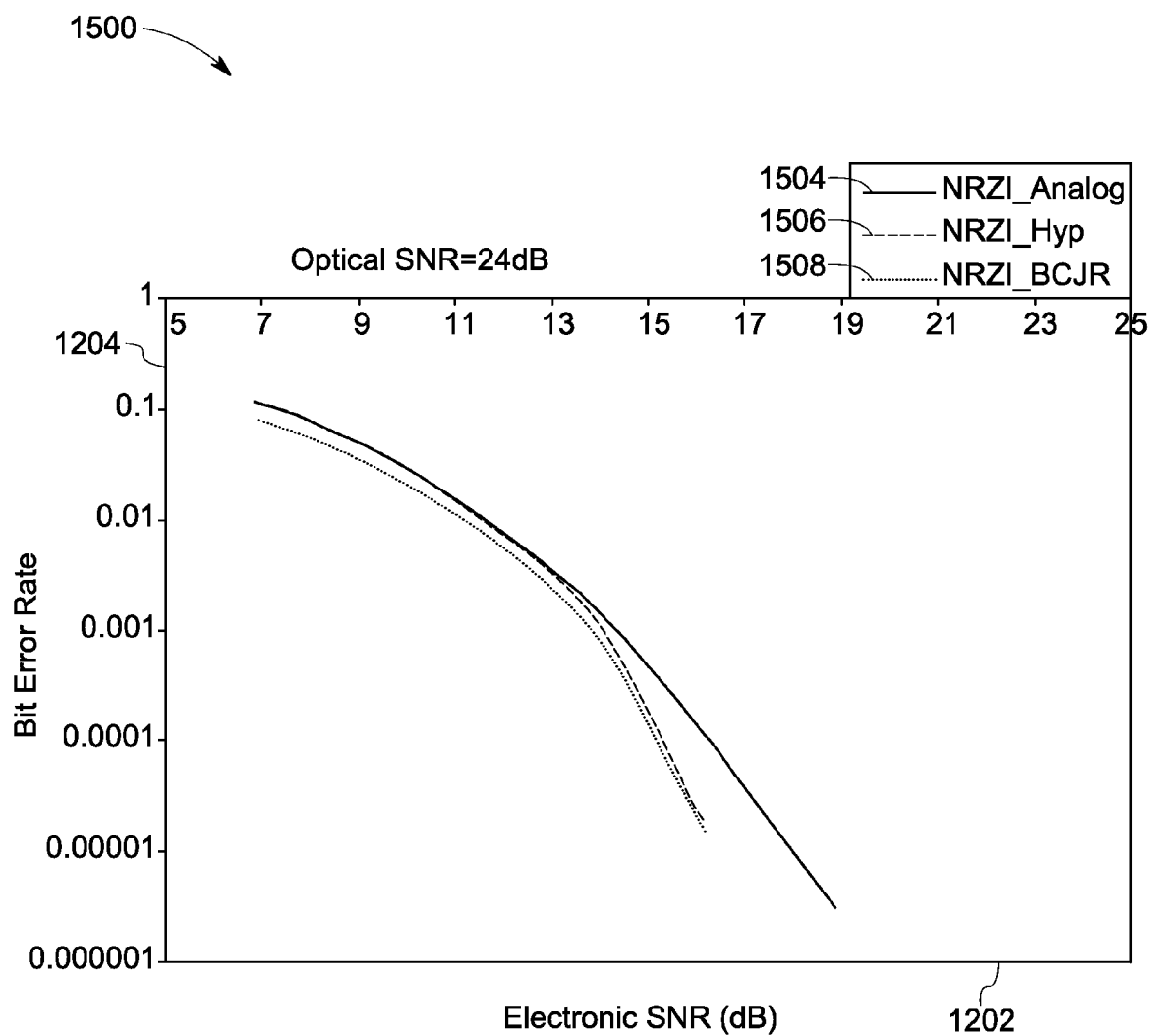
Figure 16:
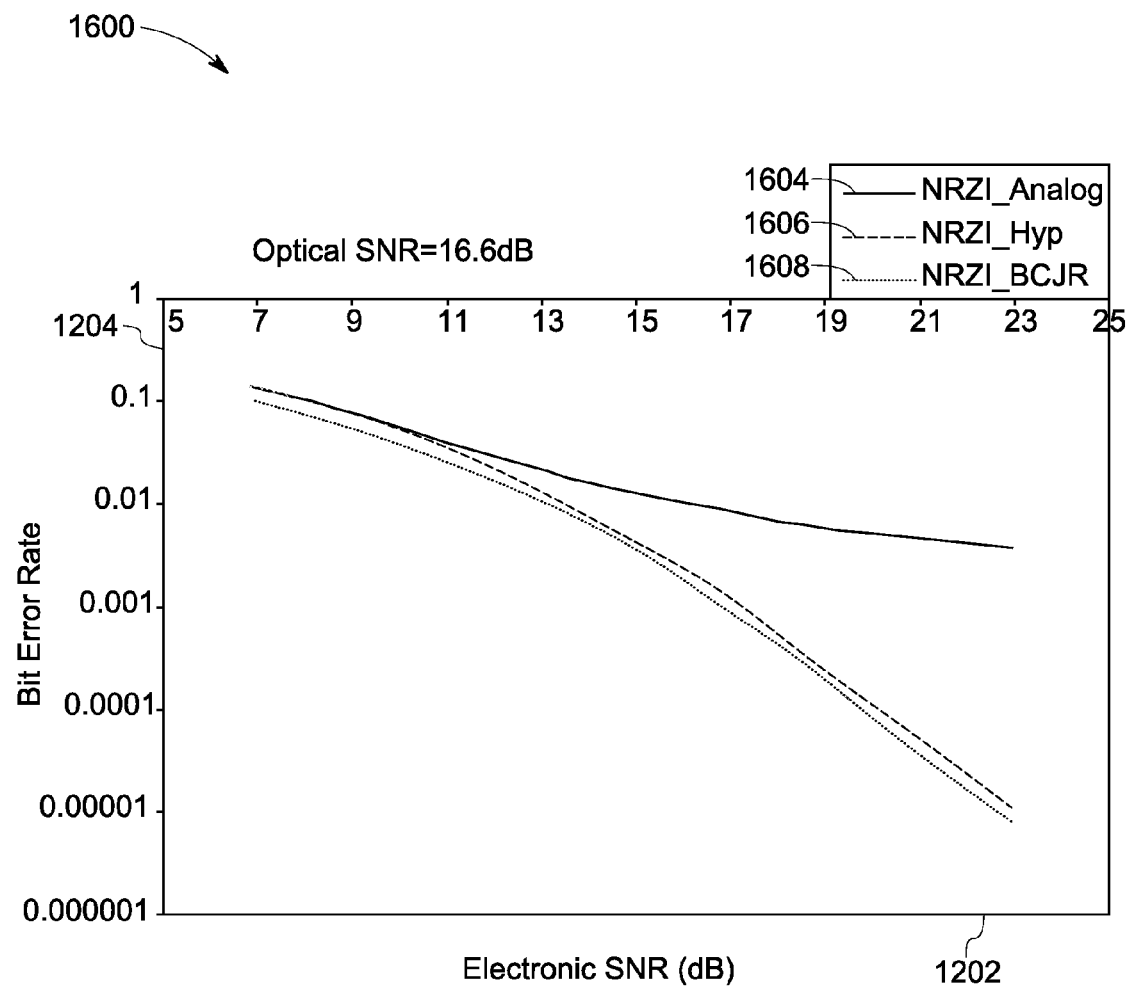
Figure 17:
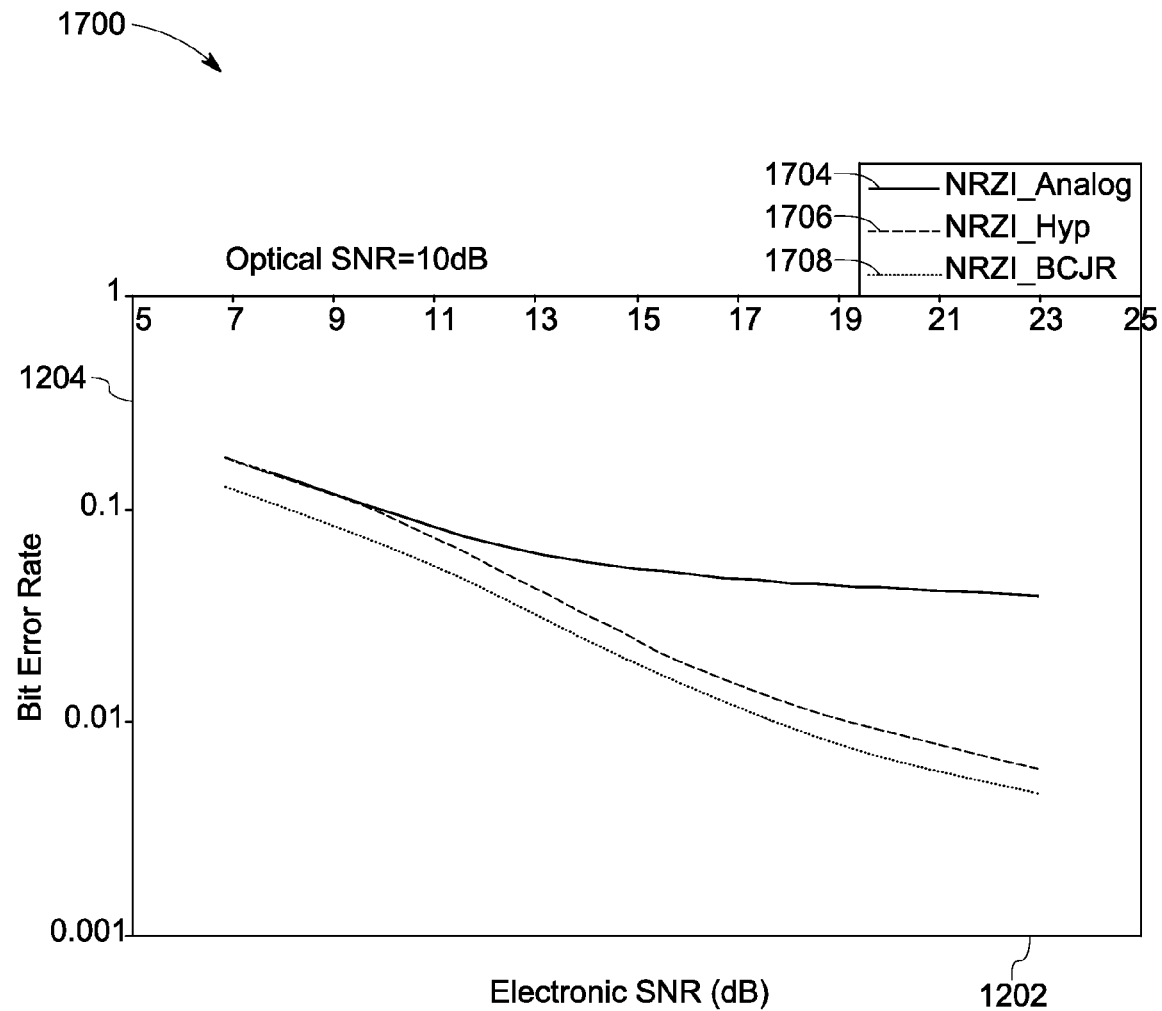

FIG. 11a is a diagrammatic illustration of NRZI coder; FIG. 11b is a table representing input-output relationship of the NRZI coder of FIG. 11a; FIG. 11c is a state diagram of the NRZI decoder of FIG. 11a; FIG. 11d is a trellis diagram corresponding to the state transition diagram of FIG. 11c;

FIG. 12, FIG. 13, and FIG. 14 illustrate the performance of various embodiments of NRZI-17PP decoding methods under various noise conditions; and FIG. 15, FIG. 16, and FIG. 17 illustrate of the performance of various embodiments of NRZI decoding methods under various noise conditions.

DETAILED DESCRIPTION

Figure 1:
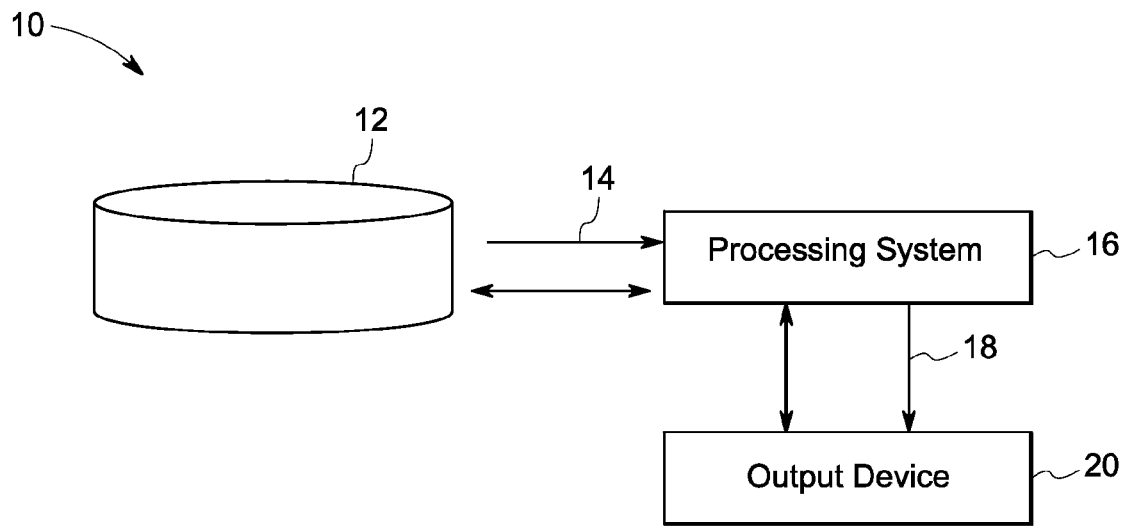
FIG. 1 is a diagrammatic illustration of a system for decoding a coded bit stream, in accordance with certain aspects of the present systems and techniques.

FIG. 1 is a diagrammatic illustration of a system 10 for decoding a coded bit stream. The system 10 includes a data storage device 12 that stores a coded bit stream 14. The data storage device 12 may be a compact disc (CD), a video CD (VCD), a digital versatile disc (DVD), a Blu-ray Disc (BD), a USB mass storage (UMS) device, a holographic Storage (HDS) device, or the like. As used herein, the term "coded bit stream" is used to refer to coded data that is generated by encoding source information using a using a Non Return to Zero Inverted (NRZI) code and/or a 17 Parity Preserve/Prohibit (17PP) code. As used herein, the term "source information" is used to refer to data that is represented in binary form to include source bits, and is encoded using an NRZI code and/or a 17PP code to generate a coded bit stream.

The system 10 further includes a processing system 16 that is in an operational communication with the data storage device 12. The processing system 16, for example, may be a decoder, an optical disk reader, a digital versatile disk player, a compact disk player, or the like. The processing system 16 receives or retrieves the coded bit stream 14 from the data storage device 12. It is noted that while in the presently contemplated configuration, the processing system 16 receives the coded bit stream 14 from the data storage device 12, in certain embodiments, the processing system 16 may receive the coded bit stream from an encoder. The processing device 16 may receive the coded bit stream via a communication channel. The communication channel, for example, may be a wireless channel, optical channel, or a wired channel. Furthermore, the processing system 16 generates a plurality of decisions 18 by processing the received coded bit stream 14. The plurality of decisions 18 are estimates of a plurality of source bits in the source information. In other words, the processing system 16 decodes the coded bit stream 14 to generate the source information with minimal errors. The processing of the coded bit stream 14 is explained in greater detail with reference to FIG. 3 and FIG. 6. The system 10 further includes an output device 20 that is in an operational communication with the processing system 16. The output device 20, for example, may be a display device, an audio device, a printer, or combinations thereof. The output device 20 receives the plurality of decisions or the estimates of the source information 18 from the processing system 16. Furthermore, the output device 20 outputs the estimates of the source information 18 in a determined format. The determined format, for example, may be an audio format, a video format, a soft copy on a display device, and the like.

Figure 2A:
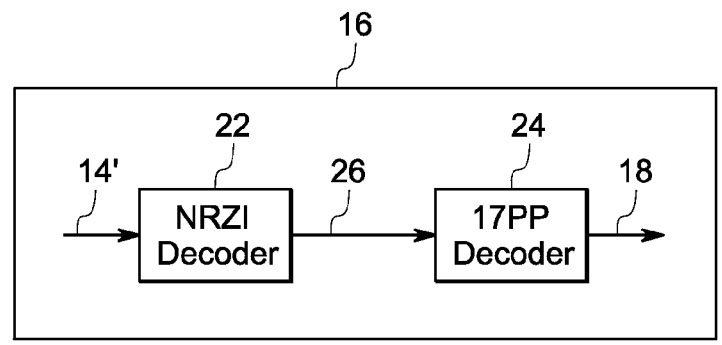
FIG. 2a illustrates the processing system referred to in FIG. 1 with NRZI decoder and 17PP decoder, in accordance with an exemplary embodiment.

FIG. 2a illustrates the processing system 16 referred to FIG. 1 in accordance with an embodiment of the present systems. In the presently contemplated configuration, the processing system 16 is a decoder. The decoder 16 includes an NRZI decoder 22 and a 17PP decoder 24. The decoder 16 receives a coded bit stream 14' from the data storage device 12 (see FIG. 1). As used herein, the term "coded bit stream 14'" is used to refer to coded data that is generated by encoding source information using an NRZI code and a 17 Parity Preserve/Prohibit (17PP) code. In the presently contemplated configuration, the NRZI decoder 22 processes the coded bit stream 14' to determine a 17PP modulated bit stream 26. The processing of the coded bit stream 14' to determine the 17PP modulated bit stream 26 is explained in greater detail with reference to FIG. 4. The processing system 16 further includes the 17PP decoder 24 that receives the 17PP modulated bit stream 26 from the NRZI decoder 22. The 17PP decoder 24 processes the 17PP modulated bit stream 26 to determine the plurality of decisions 18. The processing of the 17PP modulated bit stream 26 is explained in greater detail with reference to FIG. 5.

Figure 2B:
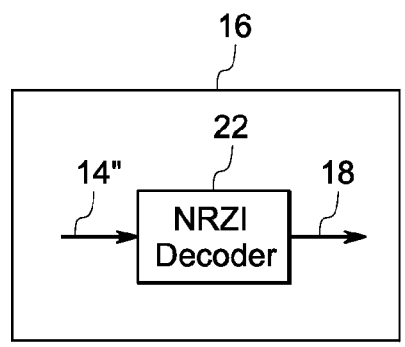
FIG. 2b illustrates the processing system referred to in FIG. 1 with NRZI decoder, in accordance with an exemplary embodiment.

FIG. 2b illustrates the processing system 16 referred to FIG. 1 in accordance with another embodiment of the present systems. In the presently contemplated configuration, the processing system 16 includes the NRZI decoder 22 that receives a coded bit stream 14" from the data storage device 12. Herein, the coded bit stream 14" is used to refer to coded data that is encoded using an NRZI code. The NRZI decoder 22 processes the coded bit stream 14" to generate the plurality of decisions 18. The NRZI decoder 22 selects an NRZI decoding method based on one or more parameters associated with noise in the coded bit stream 14". Furthermore, the NRZI decoder 22 generates the plurality of decisions 18 by processing the coded bit stream 14" using the selected NRZI decoding method. The processing of the bit stream 14" by the NRZI decoder 22 is explained in greater detail with reference to FIG. 6.

Figure 3:
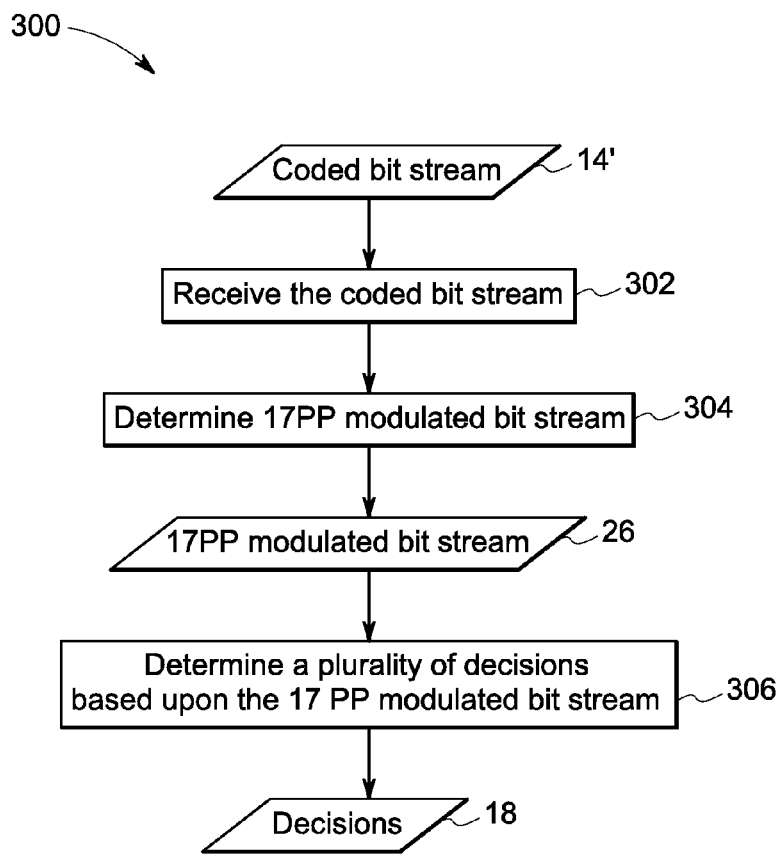
FIG. 3 is a flow chart representing a method for decoding the coded bit stream referred to in FIG. 2a, in accordance with an exemplary embodiment.

FIG. 3 is a flowchart representing an exemplary method 300 for processing or decoding the coded bit stream 14' referred to in FIG. 2a, in accordance with an embodiment of the present techniques. As noted with reference to FIG. 2a, the coded bit stream 14' is used herein to refer to coded data that is generated by encoding source information using an NRZI code and a 17 Parity Preserve/Prohibit (17PP) code. The coded bit stream 14', for example, may be processed or decoded by the processing system 16. Particularly, the coded bit stream 14' may be processed or decoded by the NRZI decoder 22 and 17PP decoder 24 referred to in FIG. 2a. As shown in FIG. 3, at step 302, the coded bit stream 14' may be received. The coded bit stream 14', for example, may be received by the processing system 16 from the data storage device 12. At step 304, a 17PP modulated bit stream is determined by processing the coded bit stream 14'. The 17PP modulated bit stream, for example, may be the 17PP modulated bit stream 26 (See FIG. 2a). The determination of the 17PP modulated bit stream is explained in greater detail with reference to FIG. 4. The 17PP modulated bit stream 26, for example, may be determined by the NRZI decoder 22.

Subsequently at step 306, a plurality of decisions 18 may be determined by processing the 17PP modulated bit stream that has been determined at step 304. The plurality of decisions 18, for example, may be generated by the 17PP decoder 24 (see FIG. 2a). It is noted that the plurality of decisions 18 are estimates of source bits in the source information. The plurality of decisions may be hard decisions or soft decisions. As used herein, the term "hard decision" is used to refer to an estimate of a source bit in source information to be '1' or '0'. Furthermore, as used herein, the term "soft decisions" is used to refer to a probability of a source bit being '0' and another probability of the source bit being '1'.

Figure 4:
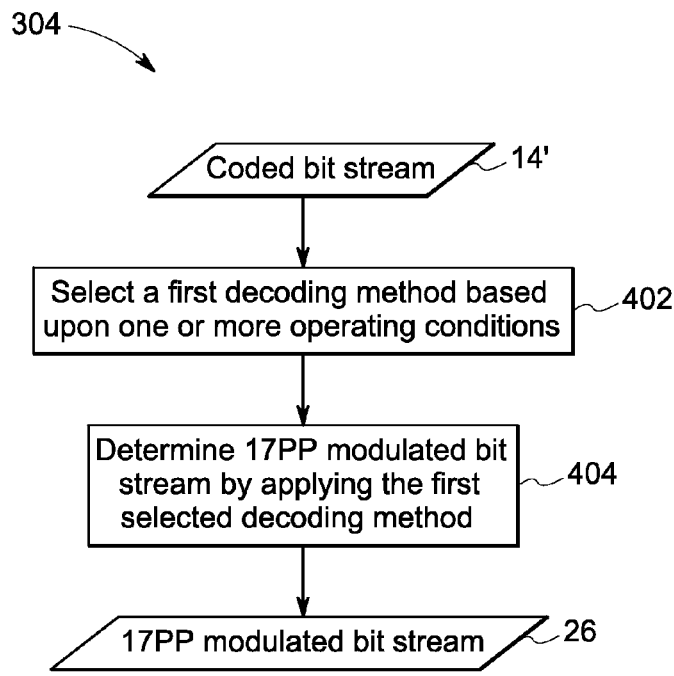
FIG. 4 is a flow chart representing a method for generating 17PP modulated bit stream, in accordance with an exemplary embodiment.

FIG. 4 is a flowchart representing an exemplary method 304 for generating the 17PP modulated bit stream 26, in accordance with an embodiment of the present techniques. Particularly, FIG. 4 explains step 304 of FIG. 3 in greater detail. At step 402, a first decoding method may be selected from a plurality of a first set of decoding methods based upon a plurality of operating conditions. The first set of decoding methods, for example, may be Non Return to Zero Inverted (NRZI) decoding methods, such as, a Bahl, Cocke, Jelinek, and Raviv (BCJR) method, a hypothesis test method, or an analog XOR method.

As used herein, the term "operating conditions" may be used to refer a Signal to Noise Ratio (SNR) in a received coded bit stream, a type of noise in the received coded bit stream, a medium of storage used for storing the coded bits, or combinations thereof. By way of a non-limiting example, when the optical and electrical signal to noise ratio is higher than 15 dB, Hypothesis test method may be selected for NRZI decoding. In accordance with another example, when sufficient computational power is available for the processing system 16, BCJR method may be employed. By way of another example, when both optical and electrical noise are very low, Analog XOR method may be used without much deterioration in BER performance. Hereinafter, the terms "first decoding method" and "first selected decoding method" shall be used interchangeably. In one embodiment, the first selected decoding method is a BCJR method. In another embodiment, the first selected decoding method is a Hypothesis method. In alternative embodiment, the first selected decoding method is an Analog XOR method.

Furthermore, at step 404, the 17PP modulated bit stream 26 may be determined by applying the first selected decoding method to the coded bit stream 14'. The application of the first selected decoding method to generate the 17PP modulated bit stream 26 depends upon the steps of processing in the first selected decoding method. The first selected decoding methods including the BCJR method, the Hypothesis method, and the Analog XOR method shall be explained in greater detail with reference to FIG. 7, FIG. 8 and FIG. 9, respectively.

Figure 5:
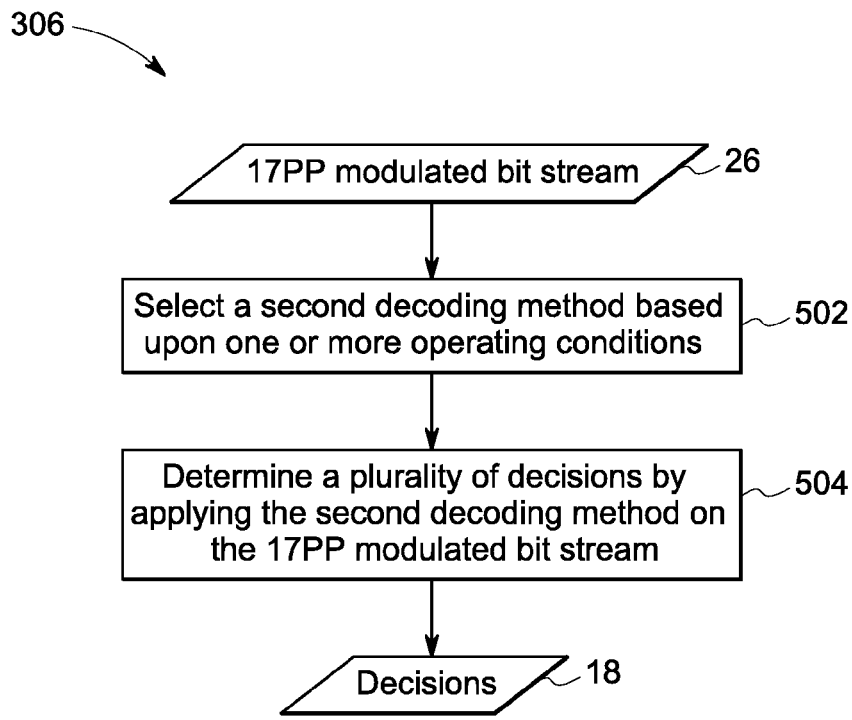
FIG. 5 is a flow chart representing a method for determining a plurality of decisions based upon the 17PP modulated bit stream, in accordance with an exemplary embodiment.

FIG. 5 is a flowchart representing an exemplary method 306 for determining the plurality of decisions 18 based upon the 17PP modulated bit stream 26, in accordance with an embodiment of the present techniques. Particularly, FIG. 5 explains step 306 in FIG. 3 in greater detail. At step 502, a second decoding method may be selected from a second set of plurality of decoding methods. The second set of plurality of decoding methods, for example, are 17PP decoding methods, such as, a BCJR method, a Naive method, or the like. The second decoding method, for example, may be selected based upon a plurality of operating conditions. The operating conditions, for example, may include a Signal to Noise Ratio (SNR) in the received coded bit stream, a type of noise in the received coded bit stream, a medium of storage used for storing the coded bits, the first selected decoding method, or combinations thereof. For example, when the first selected decoding method is an Analog XOR method, the second selected decoding method may be Naïve method. As an example, when an extremely fast processing, of the order of over 1 Mbs is required, a Naive-Hypothesis test combination may be employed. It is noted that any other methods that are computationally attractive may be selected as a second decoding method. Hereinafter, the terms "second decoding method" and "second selected decoding method" will be used interchangeably. Furthermore, at step 504, the decisions 18 may be determined by applying the second selected decoding method on the 17PP modulated bit stream 26. The second selected decoding method including the BCJR algorithm and the Naïve method is explained in greater detail with reference to FIG. 7 and FIG. 10, respectively. In one embodiment, a combination of the first selected decoding method and the second selected decoding method may include a Analog method-Naïve method combination, a Hypothesis test method-Naïve method combination, a BCJR method-Naïve method combination, a Hypothesis method-BCJR method combination and a BCJR method-BCJR method combination.

Figure 6:
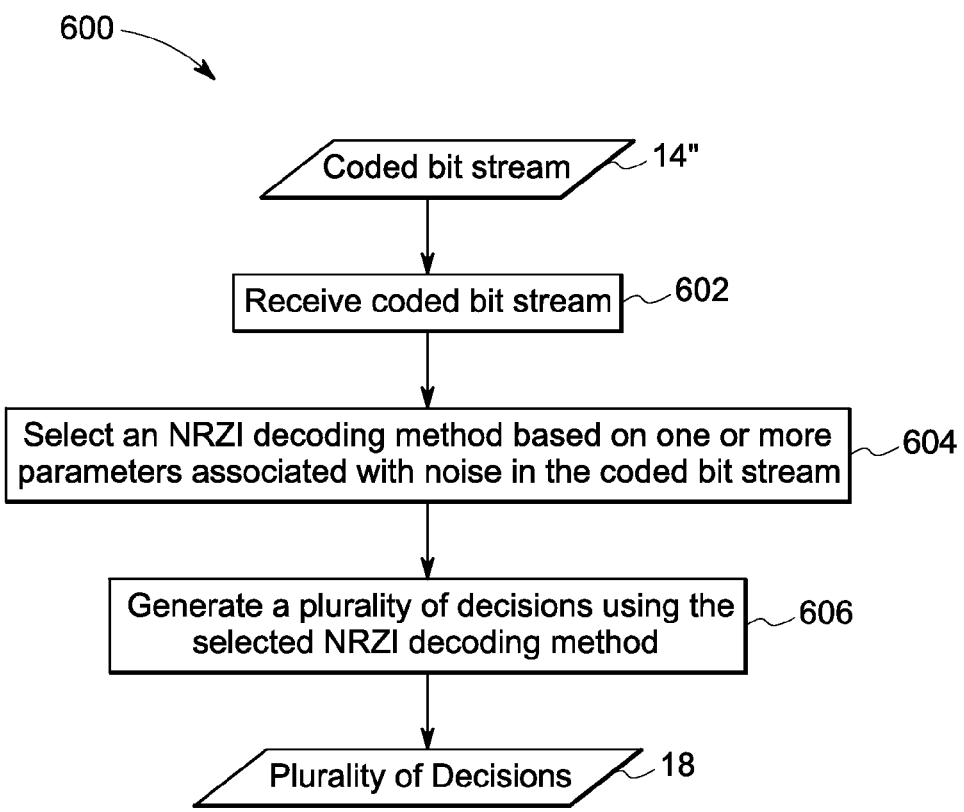
FIG. 6 is a flow chart representing a method for decoding the coded bit stream referred to in FIG. 2b, in accordance with an exemplary embodiment.

FIG. 6 is a flowchart representing an exemplary method 600 for processing or decoding the coded bit stream 14" referred to in FIG. 2b, in accordance with an embodiment of the present techniques. At step 602, the coded bit stream 14" is received by the processing system 16. Particularly, the coded bit stream 14" may be received by the NRZI decoder 22 (see FIG. 2b). As noted with reference to FIG. 2b, the term "coded bit stream 14"" is used to refer to coded data that is generated by encoding source information using a Non Return to Zero Inverted (NRZI) code. At step 604, an NRZI decoding method may be selected from a plurality of NRZI decoding methods based upon one or more parameters associated with noise in the received coded bit stream 14". The plurality of NRZI decoding methods, for example, may include a Bahl, Cocke, Jelinek, and Raviv (BCJR) method, a Hypothesis Test method, or an Analog XOR method. The one or more parameters, for example, include a type of the noise and a level of the noise in the received coded bit stream. At step 606, the plurality of decisions 18 may be generated by applying the selected NRZI decoding method. It is noted that the decisions 18 are estimates of source bits in the source information. In certain embodiments, the decisions 18 may be hard decisions or soft decisions.

As used herein, the term "hard decision" is used to refer to an estimate of a source bit in source information to be '1' or '0'. Furthermore, as used herein, the term "soft decision" is used to refer to a probability of a source bit being '0' and another probability of the source bit being '1'. It is noted that the decisions 18 are soft decisions or hard decisions are dependent on the selected NRZI decoding method. For example, when the selected NRZI decoding method is the Analog XOR method, then the decisions 18 are hard decisions. In another example, when the selected NRZI decoding method is BCJR method, then the decisions 18 are soft decisions.

Various embodiments of the selected NRZI decoding method that are used in step 304 in FIG. 3 and step 606 in FIG. 6, and 17PP decoding methods that are used in step 306 in FIG. 3 are described in detail with reference to FIGS. 7-10. Particularly, the BCJR decoding method, the Hypothesis Test method, or an Analog XOR method are explained in greater detail with reference to FIGS. 7-9. It is noted that the various embodiments of selected NRZI decoding methods and 17PP decoding methods differ in computational requirements and Bit Error Rate (BER) performance. Certain selected decoding methods are derived from an optimal decoding algorithm, such as, BCJR method by making suitable approximations and simplifications. It is noted that embodiments of the selected decoding method described with reference to FIGS. 7-9 should not be restricted to the described assumptions and approximations. The described embodiments of the selected decoding method also include various other embodiments that are derived by adopting assumptions and approximations similar to the described assumptions and described approximations.

Figure 7:
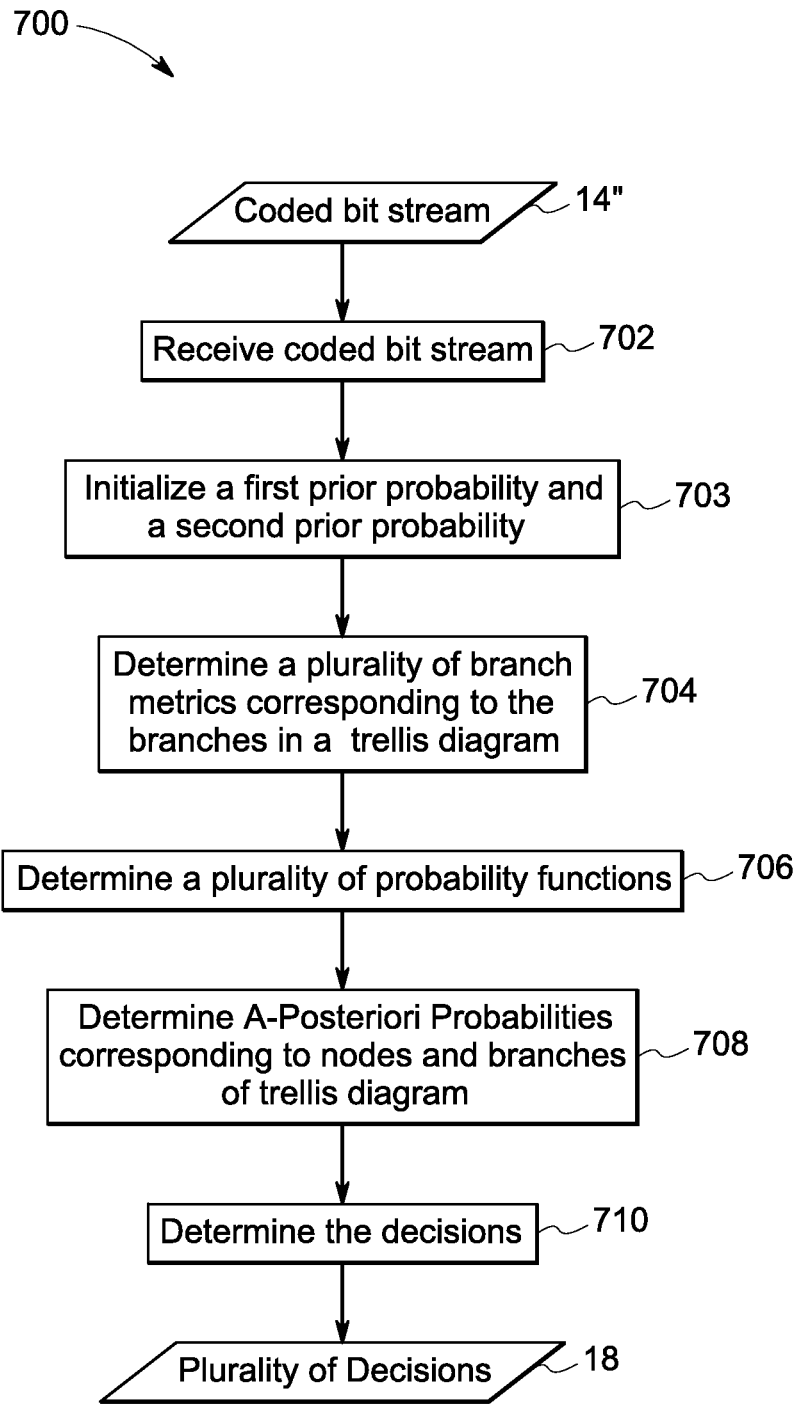
FIG. 7 is a flow chart representing BCJR decoding method, in accordance with an exemplary embodiment.

FIG. 7 is a flowchart representing an exemplary selected decoding method 700 referred to in steps 402 (first decoding method), 502 (second decoding method), 604 (selected NRZI decoding method) of FIG. 4, FIG. 5 and FIG. 6, respectively, in accordance with an embodiment of the present techniques. In one embodiment, FIG. 7 explains the steps 404, 504, 606 of FIG. 4, FIG. 5 and FIG. 6, respectively, in greater detail. In one embodiment, FIG. 7 explains an exemplary BCJR method. In the presently contemplated configuration, an optimal MAP algorithm is employed. As shown in FIG. 7, the coded bit stream is 14" is received at step 702. It is noted that while the presently contemplated configuration is explained by processing the coded bit stream 14", in certain embodiments, the 17PP modulated bit stream 26 and the coded bit stream 14' may be processed using the present method 700.

In certain embodiments, the BCJR method 700 is used as an optimal MAP algorithm. At step 703, a first prior probability and a second prior probability may be initialized. The first prior probability and the second prior probability may be used may be used by the MAP decoding method. A first prior probability that a source bit in the source information is equal to zero Pr(S=0) and a second prior probability that source bit in the source information is equal to one Pr(S=1) are initialized to suitable values in step 703. In certain embodiments, when an input to the BCJR method 700 is the coded bit stream 14', the first prior probability and the second prior probability may be initialized with unequal values. In other words, when the input to the BCJR method 700 is a 17PP-NRZI coded bit stream, the first prior probability and the second prior probability may be initialized with unequal values. In certain embodiments, when the 17PP modulated bit stream 26 is used as an input in the BCJR method, the first prior probability is equal to 0.7, and the second prior probability is equal to 0.3.

Furthermore, at step 704, a plurality of branch metrics corresponding to branches in a trellis diagram may be determined. Exemplary trellis diagram is shown with reference to FIG. 11d. Trellis diagram is derived from the state transition diagram of FIG. 11c corresponding to the NRZI coder of FIG. 11a whose input—output relationship is provided in the table of FIG. 11b. The branch metrics are, for example, determined based upon the coded bit stream 14". Subsequently, at step 706, a plurality of probability functions are determined. The plurality of probability functions, for example, may be determined by employing forward recursion and backward recursions, the coded bit stream 14" and the branch metrics. Here, the probability functions refer to the joint forward probability, conditional backward probability and/or branch metrics.

Furthermore, at step 708, A-Posteriori Probabilities (APP) for the branches in the trellis diagram and nodes in the trellis diagram are determined. Here, APPs refer to the conditional probabilities of the states and state transitions over the received coded sequence. The A-Posteriori Probabilities (APP) are determined based upon the probability functions that have been determined in step 706. Subsequently at step 710, the plurality of decisions 18 may be determined. In the presently contemplated configuration, the plurality of decisions 18 determined at step 710 are soft decisions. Instead, it is also possible to derive hard decisions just by using a threshold detector.

BCJR algorithm maximizes the A-Posteriori Probability of each bit. It is an optimum method to minimize Bit Error Rate (BER). Although, the present embodiment is explained using BCJR algorithm, other methods based on trellis may also be used. For example, Viterbi decoding method or its variants may be used. Viterbi decoding method maximizes the likelihood of each decoded code word. It is an optimum method to minimize Word Error Rate. Viterbi method may be used in steps 402 (first decoding method), 502 (second decoding method), 604 (selected NRZI decoding method) of FIG. 4, FIG. 5 and FIG. 6, respectively.

Figure 8:
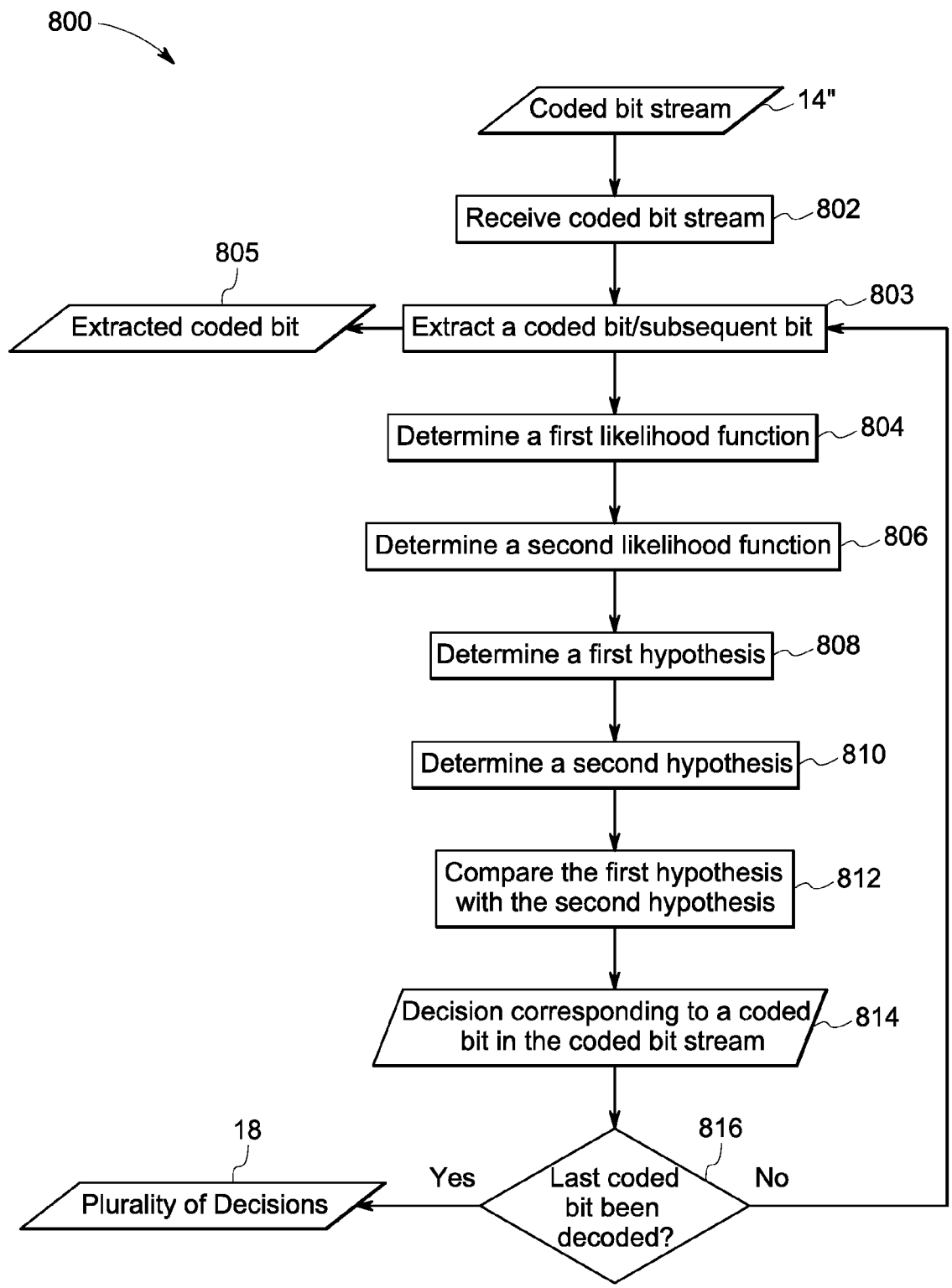
FIG. 8 is a flow chart representing Hypothesis Test decoding method, in accordance with another exemplary embodiment.

FIG. 8 is a flowchart representing another exemplary selected decoding method 800 referred to in steps 402 (first selected decoding method), 604 (selected NRZI decoding method) of FIG. 4 and FIG. 6, respectively, in accordance with an embodiment of the present techniques. In the present example, the method 800 is a bit by bit hypothesis test. Therefore, the execution of the steps 802-812 in the method 800 results in a decision 814 among the plurality of decisions 18. Particularly, each iteration of the method 800 results in determination of a single decision corresponding to a single coded bit in the coded bit stream 14". As shown in FIG. 8, the coded bit stream 14" is received at step 802. It is noted that while the presently contemplated configuration is explained by processing the coded bit stream 14", in certain embodiments, the 17PP modulated bit stream 26 and the coded bit stream 14' may be processed using the present method 800. At step 803, a coded bit 805 may be extracted. Subsequently at step 804, a first likelihood function may be determined corresponding to the coded bit 805 given that an estimate of the coded bit 805 is equal to 0.

Furthermore, at step 806, a second likelihood function corresponding to the coded bit 805 may be determined given that an estimate of the coded bit is equal to 1. The first likelihood function and the second likelihood function are determined based upon the coded bit stream 14". Furthermore, at step 808, a first hypothesis that the decision 814 is equal to zero may be determined. Similarly at step 810, a second hypothesis that the decision 814 is equal to 1 may be determined. The first hypothesis and the second hypothesis are determined based upon the first likelihood function and the second likelihood function. By way of a non-limiting example, a first hypothesis that the decision 814 corresponding to the coded bit 805 in the coded bit stream 14" is equal to 0 is as follows:

$$Pr\{X=0:Y_t\}=Pr(Y_t|0)\cdot Pr(Y_{t-1}|0)+Pr(Y_t|1)\cdot Pr(Y_{t-1}|1) \quad (1)$$

Furthermore, by way of the non-limiting example, the second hypothesis that the decision 814 corresponding to the coded bit 805 is equal to 1 is as follows:

$$Pr\{X=1:Y_t\}=Pr(Y_t|0)\cdot Pr(Y_{t-1}|1)+Pr(Y_t|1)\cdot Pr(Y_{t-1}|0) \quad (2)$$

where, Y represents a coded bit, X represents a decision, t represents an instance of time, $Y_t$ represents the received coded bit at a time instant t, and $Y_{t-1}$ a received coded bit at a time instant t−1.

At step 812, the first hypothesis is compared to the second hypothesis to determine the decision 814. The decision 814, for example, may be a soft decision or a hard decision. For, example, the comparison of the first hypothesis to the second hypothesis may be represented by the following equation:

$$X=0 \text{ if } Pr\{X=0:Y_t\}>Pr\{X=1:Y_t\} \quad (3)$$

X=1 otherwise where X represents a decision or an estimate of a source bit in source information, Y represents a coded bit in the coded bit stream. As an example, when hard decisions are considered, whenever the value of the first hypothesis is greater than the value of the second hypothesis, a decision corresponding to the first hypothesis is favored and in this case, the decision is equal to zero. Alternatively, when the first hypothesis is lesser than or equal to the second hypothesis, a decision corresponding to the second hypothesis may be favored and in this decision is equal to one. Hereinafter, the equation (3) is referred to as decoding rule. It is noted from the equation (3), the first hypothesis of equation (1) and the second hypothesis of equation (2), the decoding rule involves the current coded bits and the previous coded bits. The first hypothesis given by equation (1) and the second hypothesis given by equation (2) are derived from BCJR method with the assumption that prior probabilities are equal to 0.5. With this assumption, the probability function corresponding to the branch metric simplifies to:

$$\gamma_t(n,m)=Pr\{S_t=m;Y_t|S_{t-1}=n\}=0.5\,Pr\{Y_t|m\} \quad (4)$$

where, $Pr\{Y_t|m\}$ is a conditional probability of a coded bit on the present state of a trellis, m is a present state of a trellis diagram and n is a previous state of a trellis diagram. Therefore, without assuming the bias from 17PP input, we can decode each NRZI bit using a simple hypothesis test, involving two consecutive bits.

It is noted that the method 800 decodes the coded bit stream 14" on a bit-by-bit basis. Therefore, the steps 803 to 812 may be iterated till the last coded bit in the coded bit stream 14" is decoded. In other words, the steps 803-812 may be iterated till a decision corresponding to each coded bit in the coded bit stream 14" has been determined. Accordingly at step 816, a check is carried out to determine whether the last coded bit in the coded bit stream 14" has been decoded. At step 816, when it is determined that the last coded bit in the coded bit stream has not been decoded, the control is transferred to step 803. At step 803, a subsequent coded bit in the coded bit stream 14" is selected. Subsequently the steps 803-812 are iterated. However, at step 816, when it is determined that the last coded bit in the coded bit stream 14" has been decoded, then the plurality of decisions 18 are determined. In the presently contemplated configuration, the plurality of decisions 18 include each decision 814 that has been determined in each iteration of the steps 803-814.

It is noted that the method 800 that determines decisions on a bit by bit basis is faster in comparison to a sequence detection involving MAP (BCJR method). The method 800 provides may operate with less and acceptable bit error rate (BER) performance while having extremely low complexity. For example, this method 800 may be selected as the first selected decoding method at step 402 in FIG. 4, and the NRZI decoding method at step 604 for high data rate applications, such as, Holographic Data Storage.

Figure 9:
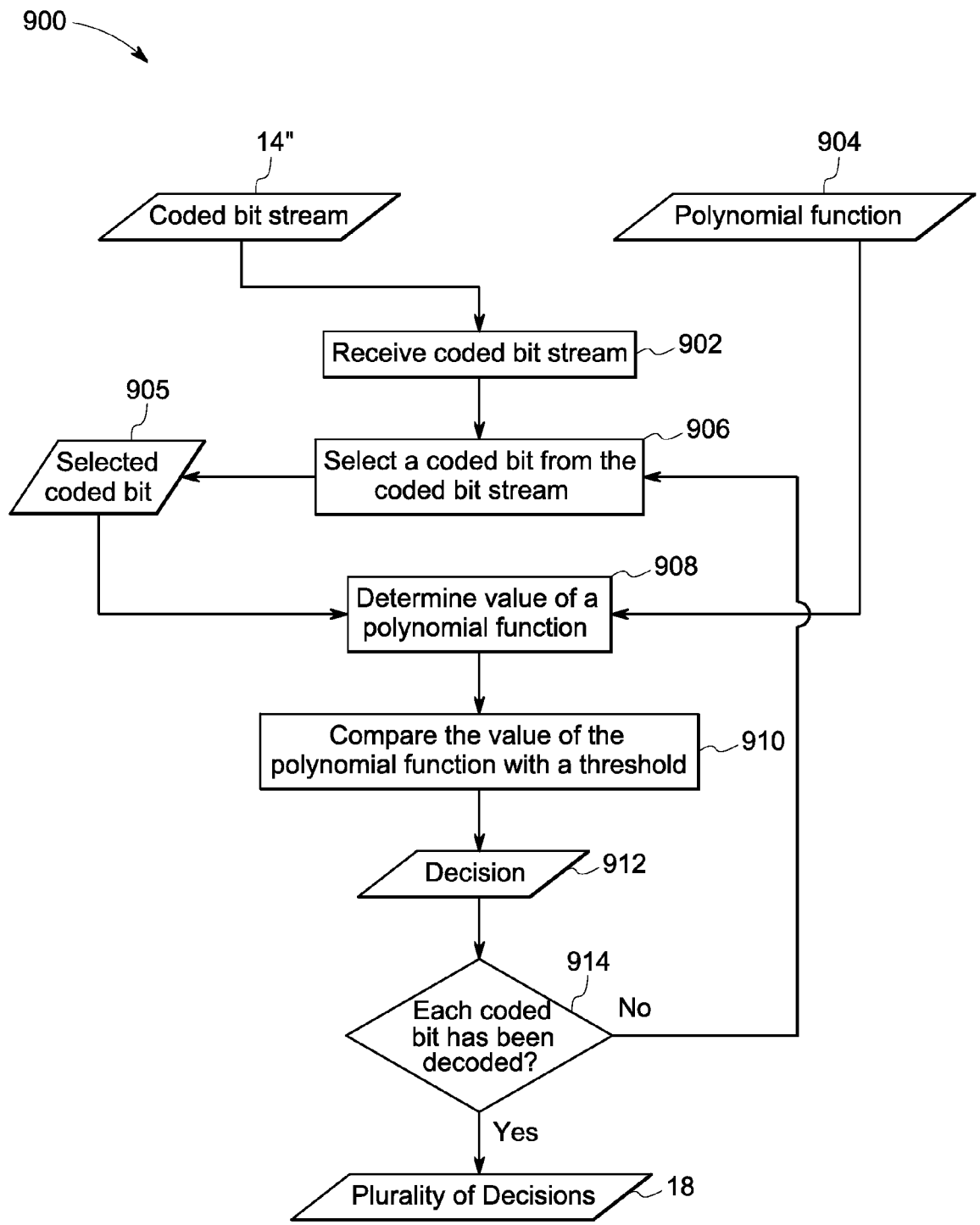
FIG. 9 is a flow chart representing Analog XOR decoding method, in accordance with an exemplary embodiment.

FIG. 9 is a flowchart representing another exemplary selected decoding method 900 referred to in steps 402 (first selected decoding method) and step 604 (selected NRZI decoding method) of FIG. 4 and FIG. 6, respectively, in accordance with an embodiment of the present techniques. Particularly, FIG. 9 explains exemplary steps of Analog XOR method. In one embodiment, FIG. 9 explains the steps 404, 606 of FIG. 4, and FIG. 6, respectively, in greater detail. As shown in FIG. 9, the coded bit stream 14" is received at step 902. It is noted that while the presently contemplated configuration is explained by processing the coded bit stream 14", in certain embodiments, the 17PP modulated bit stream 26 and the coded bit stream 14' may be processed using the present method 900.

Furthermore, at step 906, values of a polynomial function 904 may be determined using the coded bit stream 14". In one embodiment, the polynomial function 904 is determined based upon the coded bit stream 14". The polynomial function 904, for example, may be determined based upon the value of a coded bit 908 being 1 or 0. For example, assuming a Gaussian channel, when the coded bit stream 14" includes Gaussian noise, the hypothesis of equation (1) and equation (2) corresponding to the coded bit being 0 or 1 simplifies to:

$$Pr\{X=0:Y_t\}=(Y_{t-1}Y_t)^2+(Y_{t-1}-1)^2(Y_t-1)^2$$

$$Pr\{X=1:Y_t\}=(Y_{t-1})^2+(Y_{t-1}-1)^2(Y_t-1)^2(Y_t)^2 \quad (5)$$

A coded bit may be decoded as:

$$X=1 \text{ when } Pr\{X=0:Y^t\}\leq Pr\{X=1:Y_t\} \quad (6)$$

X=0; otherwise

The abovementioned equations (5) and (6) are solved to determine the following exemplary polynomial function based decision as shown below:

$$P(Y)=Y_t+Y_{t-1}-2Y_tY_{t-1}\leq 0.5 \quad (7)$$

where P(Y) is a polynomial function of Y, $Y_t$ is a selected coded bit stream at a time instant t, $Y_{t-1}$ is a selected coded bit stream at a time instant t−1. While arriving at equation (5), a crude estimate of the Normal probability distribution as proportionate to the square of the signal strength is used. Since the probability function corresponding to 0 has to be a decreasing function and the probability function corresponding to 1 has to be an increasing function, they are approximated as $(Y_t)^2$ and $(Y_t-1)^2$.

Subsequently, at step 906, a coded bit 905 is selected from the coded bit stream 14". In the first iteration of the method 900, a first coded bit may be selected. Subsequently, at step 908, a value of the polynomial function 904 is determined based upon the selected coded bit 905. Furthermore, at step 910, the value of the polynomial function may be compared to a determined threshold value. A reasonable setting for the threshold value is 0.5, as that is in the middle of the two possible outputs under noiseless conditions. The decision 912 may be determined based upon the comparison of the value of the polynomial function with the threshold. Equation (8) shows determination of the decision 912 based upon the comparison of the value of the polynomial function 904 and the threshold value.

$$X=0; \text{ when } Y_t+Y_{t-1}2Y_tY_{t-1}\leq 0.5 \quad (8)$$

X=1; otherwise
where X is a decision or an estimate of a source bit in source information; $Y_t$ is a selected coded bit stream at a time instant t, $Y_{t-1}$ is a selected coded bit stream at a time instant t−1. Subsequent to the comparison of the value of the polynomial function 904 to the threshold, a decision 912 may be determined.

Furthermore, at step 914, a check is carried out to determine whether each coded bit in the coded bit stream 14" has been decoded. In other words, it is determined whether a decision corresponding to each coded bit in the coded bit stream 14" has been determined. When it is determined that a decision corresponding to each coded bit in the coded bit stream 14" has not been determined, the control is transferred to step 906. At step 906, another coded bit is selected from the coded bit stream 14". In one embodiment, a coded bit subsequent to the previously selected coded bit is selected at step 906. Subsequently the steps 906 to 912 are repeated to determine a decision corresponding to the selected coded bit. With returning reference to step 914, when it is determined that each coded bit in the coded bit stream 14" has been decoded, the decisions 18 are determined. In this embodiment, the decisions 18 include each decision 912 that has been determined in each iteration of the steps 902 to 912.

Figure 10:
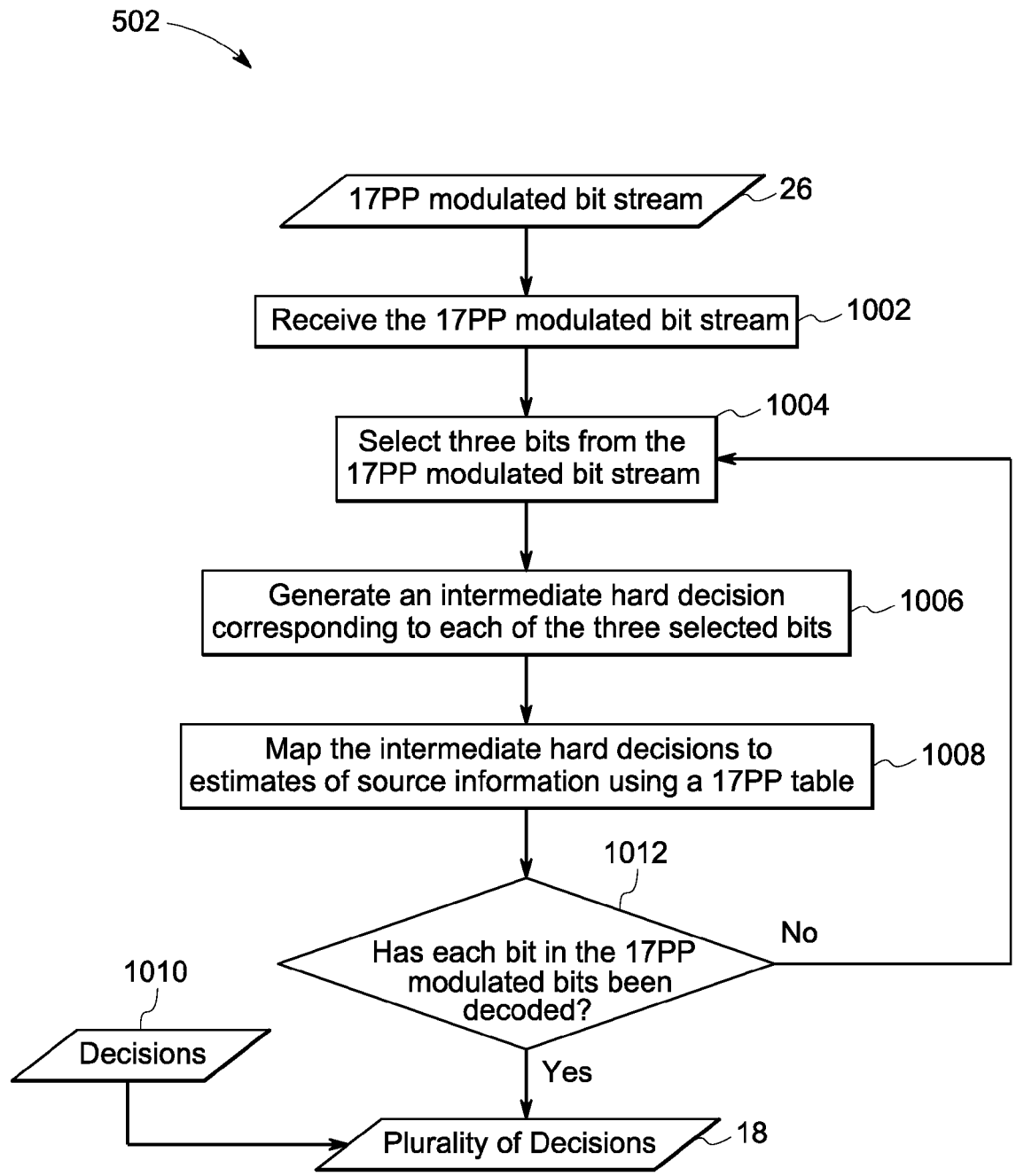
FIG. 10 is a flow chart representing Naive decoding method, in accordance with an exemplary embodiment.

FIG. 10 is a flowchart representing an exemplary second decoding method 502 referred to in step 502 in FIG. 5, in accordance with an embodiment of the present techniques. In one embodiment, FIG. 10 explains Naive method in greater detail. In the Naive method a noisy coded bit stream is converted to hard decisions using a determined threshold. At step 1002, the 17PP modulated bit stream 26 may be received. The 17PP modulated bit stream 26, for example, may be received by the 17PP decoder 24 (see FIG. 2a) from the data storage device 12 (see FIG. 1). At step 1004, three bits from the 17PP modulated bit stream 26 may be selected. In the first iteration of the method 502, the first three bits in the modulated bit stream 26 may be selected.

Subsequently, at step 1006, a plurality of intermediate hard decisions may be generated corresponding to the selected three bits. In one embodiment, an intermediate hard decision may be generated corresponding to each of the three selected bits. The hard decisions, for example, may be generated by comparing the values of each of the selected three bits to a determined threshold. The threshold, for example, may be determined using the following equation:

$$\text{Threshold} = \frac{\frac{\sigma_A}{2} + \frac{\sigma_E}{2}}{2\sigma_A + \sigma_E} \quad (9)$$

where $\sigma_A$ is representative of optical noise components in the 17PP modulated bit stream 26, and $\sigma_E$ is representative of electronic noise components in the 17PP modulated bit stream 26.

Furthermore at step 1008, the intermediate hard decisions may be mapped to estimates of source information in a 17PP table. An exemplary 17PP table is shown below as Table 1. The estimates of the source information are decisions 1010 corresponding to the selected three bits. Table 1 is shown for exemplary purposes, and should not be restricted to the specific values and counts.

Subsequently at step 1012 a check is carried out to determine whether each bit in the 17PP modulated bit stream 26 has been decoded. In other words, at step 1012, it is verified whether the decisions 1010 corresponding to each bit in the 17PP modulated bit stream 26 has been determined. At step 1012 when it is verified that the decision 1012 corresponding to each bit in the 17PP modulated bit stream 26 has not been determined, the control is transferred to step 1004. At step 1004, consecutive three bits to the previous three bits that have been selected at step 1004 in earlier iteration is selected. Furthermore, the steps 1004 to 1008 are repeated using the three consecutive three bits. At step 1008, the mapping of intermediate hard decisions to estimate of source information depends on the present and the previous states as shown in the 17PP table entries. With returning reference to step 1012, when it is determined that each bit in the 17PP modulated bit stream 26 has been decoded, the decisions 18 are determined. It is noted that in this embodiment, the decisions 18 include each decision 1010 that is determined in each iteration of the steps 1004 to 1012.

TABLE 1

| Previous state | Estimate of source information | Intermediate hard decision | Present state |
|---|---|---|---|
| 0 | 10 | 001 | 0 |
| 0 | 00 | 000 | 5 |
| 0 | 00 | 010 | 4 |

Simulations were carried out to verify the performance of various embodiments of the present invention. FIG. 12, FIG. 13 and FIG. 14 illustrate graphical representation of the performance of various embodiments of the NRZI-17PP decoding methods under various noise conditions. In the simulations, about 1000 sequences of 500 bits of coded bit stream were used. Different electronic and optical noise energy levels were considered in evaluating the performance of the decoding methods. Electronic SNRs in the range of 5 dB to 21 dB with Optical SNRs varying between 10 dB to 21 dB were considered. In graphs 1200, 1300 and 1400, X-axis 1202 represent electronic noise levels and Y-axis 1204 represents Bit Error Rate (BER). Performance of BCJR decoding method for 17PP encoded bit stream shown in profiles 1216, 1316 and 1416 of FIG. 12, FIG. 13 and FIG. 14 are used as baseline for comparing performance of various NRZI-17PP decoding methods.

The simplest scheme among the NRZI-17PP decoding methods, involves decoding the NRZI using Analog XOR and decoding the 17PP using the Naïve scheme. The performance of Analog XOR—Naïve method shown in profiles 1206, 1306 and 1406 of FIGS. 12-14 are comparable to the others at low noise levels. At medium noise levels of 17 dB, the baseline case has a coding gain of 1 dB over the selected decoding methods namely Hypothesis-Naïve, BCJR-Naïve, Hypothesis-BCJR and BCJR-BCJR decoding methods as illustrated in FIG. 13. Since there is a marginal difference in the performance among these decoding methods, the one with the minimum complexity could be conveniently selected.

In another embodiment of the present techniques, a combination of the Hypothesis test for the NRZI stage and Naïve decoder for the 17PP stage is used. Profiles 1208, 1308 and 1408 of FIG. 12, FIG. 13 and FIG. 14 respectively illustrate graphical representation of performance of Naïve-Hypothesis decoding method. This combination may be decoded on a bit by bit basis and is extremely fast (over 1mbps tested in a PC). Compared to the sequence detection involving MAP detection (using BCJR algorithm) the Bit-by-Bit detection has significantly lower complexity and may be implemented in software or low complexity hardware.

The performance of various NRZI algorithms is independently evaluated. For generating the results, an input 17PP coded bit sequence is converted to NRZI and then decoded back after addition of channel noise. The decoded bits are then compared to the input 17PP sequence to find the bit error rates at the NRZI decoding stage. FIG. 14, FIG. 15 and FIG. 16 illustrate the performance of various embodiments of the NRZI decoding algorithms under various noise conditions.

The decoding method using the full BCJR performs the best under all circumstances. Profiles 1504, 1604 and 1704 of FIG. 15, FIG. 16 and FIG. 17 respectively show the Analog XoR scheme which is comparable to the other two schemes only at low Electronic and Optical Noise. The comparison between the full BCJR (profiles 1508, 1608 and 1708 of FIGS. 12-14) and the bit-by-bit hypothesis testing (profiles 1506, 1606 and 1706 of FIGS. 12-14) is more interesting. Only at very high electronic and optical noise, there is a significant difference in the performance between the two schemes. In fact, under most acceptable operating conditions (over 15 dB optical and electronic SNR) there is less than 1 dB gain using the BCJR.

The present methods and techniques cascade NRZI decoder/NRZI decoding techniques with the 17PP decoder/17PP decoding techniques to avoid usage of super trellis which is computationally demanding. The present systems and techniques employ computationally attractive methods, such as, hypothesis test, Analog XOR, or the like in the NRZI decoder. Furthermore, simpler methods, such as, Naïve methods may be used in the 17PP decoder. Thus, the cascading of the NRZI decoder with the 17PP decoder results in significant computational savings. For example, use of Analog XOR decoding method in NRZI decoder and Naïve decoding method in 17PP decoder offers increased computational savings. The present techniques and methods may be advantageous in fast and massive data processing applications, such as, holographic data retrieval systems. Furthermore, Hypothesis test method performs NRZI decoding on a bit by bit basis and reduces the complexity of decoding. Analog XOR decoding method employs evaluation of a polynomial function and offers additional computational savings.

It is to be understood that not necessarily all such objects or advantages described above may be achieved in accordance with any particular embodiment. Thus, for example, those skilled in the art will recognize that the systems and techniques described herein may be embodied or carried out in a manner that achieves or optimizes one advantage or group of advantages as taught herein without necessarily achieving other objects or advantages as may be taught or suggested herein.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed as new and desired to be protected by Letters Patent of the United States is:

1. A method, comprising:
    receiving a coded bit stream that is encoded using a Non Return to Zero Inverted (NRZI) code and a 17 Parity Preserve/Prohibit (17PP) code;
    determining a 17PP modulated bit stream based upon the coded bit stream using a first selected decoding method; and
    generating a plurality of decisions by processing the 17PP modulated bit stream using a second selected decoding method,
    wherein the received coded bit stream comprises a plurality of coded bits, and the plurality of decisions are estimates of a plurality of source bits in a source information.

2. The method of claim 1, further comprising selecting the first selected decoding method and the second selected decoding method based upon at least one of a plurality of parameters associated with the received coded bit stream.

3. The method of claim 2, wherein the plurality of operating conditions comprise a Signal to Noise Ratio (SNR) of the received coded bit stream, a type of noise in the received coded bit stream, a medium of storage used for storing the coded bits, or combinations thereof.

4. The method of claim 3, wherein the type of the noise comprises optical noise and electrical noise.

5. The method of claim 1, wherein the first selected decoding method comprises a Non Return to Zero Inverted (NRZI) decoding method.

6. The method of claim 5, wherein the NRZI decoding method comprises a Bahl, Cocke, Jelinek, and Raviv (BCJR) method, a hypothesis test method, or an analog XOR method.

7. The method of claim 1, wherein the second selected decoding method comprises a 17PP decoding method.

8. The method of claim 7, wherein the 17PP decoding method comprises a Bahl, Cocke, Jelinek, and Raviv (BCJR) method, or a threshold based Naïve method.

9. The method of claim 1, wherein the first selected decoding method and the second selected decoding method comprises a Maximum A-posteriori Probability (MAP) decoding method.

10. The method of claim 1, wherein the first selected decoding method comprises: initializing a first prior probability equal to 0.5 of a bit that has a numeric value equal to '0', and a second prior probability equal to 0.5 of a bit that has a numeric value equal to '1'.

11. The method of claim 1, wherein the first selected decoding method comprises: initializing a prior probability equal to 0.7 of a bit that has a numeric value equal to '0', and a second prior probability equal to 0.3 of a bit that has a numeric value equal to '1'.

12. The method of claim 1, wherein the first selected decoding method is based on a Gaussian Channel model.

13. The method of claim 1, wherein the second selected decoding method comprises a threshold based method.

14. The method of claim 13, wherein the threshold based method comprises: selecting a threshold based upon electrical noise energy and optical noise energy in the received coded bit stream.

15. The method of claim 1, wherein the second selected decoding method comprises determining the source information based upon a look up table.

16. A decoding method, comprising:
    receiving a coded bit stream that is encoded using a Non Return to Zero Inverted (NRZI) code and a 17 Parity Preserve/Prohibit (17PP) code;
    selecting a combination of a NRZI decoding method and a 17PP decoding method from a plurality of NRZI decoding methods and a plurality of 17PP decoding methods, respectively based upon a plurality of operating conditions;
    determining a 17PP modulated bit stream based upon the coded bit stream using the NRZI decoding method; and
    determining source information based upon the 17PP modulated bit stream using the 17PP decoding method.

17. The method of claim 16, wherein the combination of a NRZI decoding method and a 17PP decoding method comprises a Analog XOR method-Naïve method combination, a Hypothesis test method-Naïve method combination, a BCJR method-Naïve method combination, a Hypothesis method-BCJR method combination and a BCJR method-BCJR method combination.

18. A system comprising;
    a data storage device that stores a coded bit stream that is encoded using a Non Return to Zero Inverted (NRZI) code and a 17 Parity Preserve/Prohibit (17PP) code;
    a processing system that is in an operational communication with the data storage device, wherein the processing system is configured to:

determine a 17PP modulated bit stream based upon the coded bit stream using an NRZI decoder; and generate a plurality of decisions by processing the 17PP modulated bit stream using a 17PP decoder, wherein the coded bit stream comprises a plurality of coded bits, and the plurality of decisions are estimates of a plurality of source bits in a source information.

19. The system of claim 18, wherein the data storage device comprises an optical storage device, an optical disk, or a universal serial bus (USB) device.

20. The system of claim 18, further comprising an output device that outputs the source information in a determined format.

21. The system of claim 20, wherein the output device comprises a display device, an audio device, a printer, or combinations thereof.

22. The system of claim 18, wherein the processing system comprises a decoder, an optical disk reader, a digital versatile disk player, a compact disk player.

23. A system comprising;

a data storage device that stores a coded bit stream that is encoded using a Non Return to Zero Inverted (NRZI) code and a 17 Parity Preserve/Prohibit (17PP) code;

a processing system that is in an operational communication with the data storage device, wherein the processing system is configured to:

determine a 17PP modulated bit stream based upon the coded bit stream using a Hypothesis test decoding method; and generate a plurality of decisions by processing the 17PP modulated bit stream using a Naive decoding method, wherein the coded bit stream comprises a plurality of coded bits, and the plurality of decisions are estimates of a plurality of source bits in a source information.

24. A system, comprising;

a data storage device that stores a coded bit stream that is encoded using a Non Return to Zero Inverted (NRZI) code and a 17 Parity Preserve/Prohibit (17PP) code;

a processing system that is in an operational communication with the data storage device, wherein the processing system is configured to:

determine a 17PP modulated bit stream based upon the coded bit stream using a Hypothesis test decoding method; and generate a plurality of decisions by processing the 17PP modulated bit stream using a BCJR method, wherein the coded bit stream comprises a plurality of coded bits, and the plurality of decisions are estimates of a plurality of source bits in a source information.

25. A communication system comprising:

an encoder generating a coded bit stream that is encoded using a Non Return to Zero Inverted (NRZI) code and a 17 Parity Preserve/Prohibit (17PP) code;

a decoder that receives the coded bit stream via a communication channel, wherein the decoder is configured to:

determine a 17PP modulated bit stream based upon the received coded bit stream using an NRZI decoder; and generate a plurality of decisions by processing the 17PP modulated bit stream using a 17PP decoder, wherein the coded bit stream comprises a plurality of coded bits, and the plurality of decisions are estimates of source bits in a source information.

* * * * *